United States Patent
Ueda et al.

(10) Patent No.: US 7,649,792 B2
(45) Date of Patent: Jan. 19, 2010

(54) SENSE AMPLIFIER

(75) Inventors: Yoshihiro Ueda, Yokohama (JP);
Yoshihisa Iwata, Yokohama (JP);
Toshiaki Edahiro, Yokohama (JP);
Toshihiro Suzuki, Kawasaki (JP)

(73) Assignee: Kabushiki Kaisha Toshiba, Tokyo (JP)

( * ) Notice: Subject to any disclaimer, the term of this patent is extended or adjusted under 35 U.S.C. 154(b) by 0 days.

(21) Appl. No.: 11/749,412

(22) Filed: May 16, 2007

(65) Prior Publication Data

US 2007/0280021 A1     Dec. 6, 2007

(30) Foreign Application Priority Data

May 30, 2006    (JP)   ............... 2006-150554

(51) Int. Cl.
*G11C 7/02*   (2006.01)
(52) U.S. Cl. .................. 365/207; 365/185.21; 365/205
(58) Field of Classification Search ............ 365/185.21, 365/205, 207
See application file for complete search history.

(56) References Cited

U.S. PATENT DOCUMENTS

| | | | |
|---|---|---|---|
| 4,843,264 A | 6/1989 | Galbraith | |
| 5,695,864 A | 12/1997 | Slonczewski | |
| 6,680,867 B2* | 1/2004 | Hanzawa et al. | 365/189.02 |
| 2002/0180491 A1* | 12/2002 | Song et al. | 327/55 |
| 2004/0208061 A1* | 10/2004 | Toda | 365/185.21 |

FOREIGN PATENT DOCUMENTS

JP    2005-285161    10/2005

OTHER PUBLICATIONS

Travis N. Blalock, et al., "A High-Speed Clamped Bit-Line Current-Mode Sense Amplifier", IEEE Journal of Solid-State Circuits, vol. 26, No. 4, Apr. 1991, pp. 542-548.

* cited by examiner

*Primary Examiner*—Hoai V Ho
*Assistant Examiner*—Anthan T Tran
(74) *Attorney, Agent, or Firm*—Oblon, Spivak, McClelland, Maier & Neustadt, L.L.P.

(57) ABSTRACT

A sense amplifier according to an example of the present invention has first, second, third and fourth FETs with a flip-flop connection. A drain of a fifth FET is connected to a first input node, and its source is connected to a power source node. A drain of a sixth FET is connected to a second input node, and its source is connected to the power source node. A sense operation is started by charging a first output node from the first input node with a first current and by charging a second output node from the second input node with a second current. The fifth and sixth FET are turned on after starting the sense operation.

10 Claims, 13 Drawing Sheets

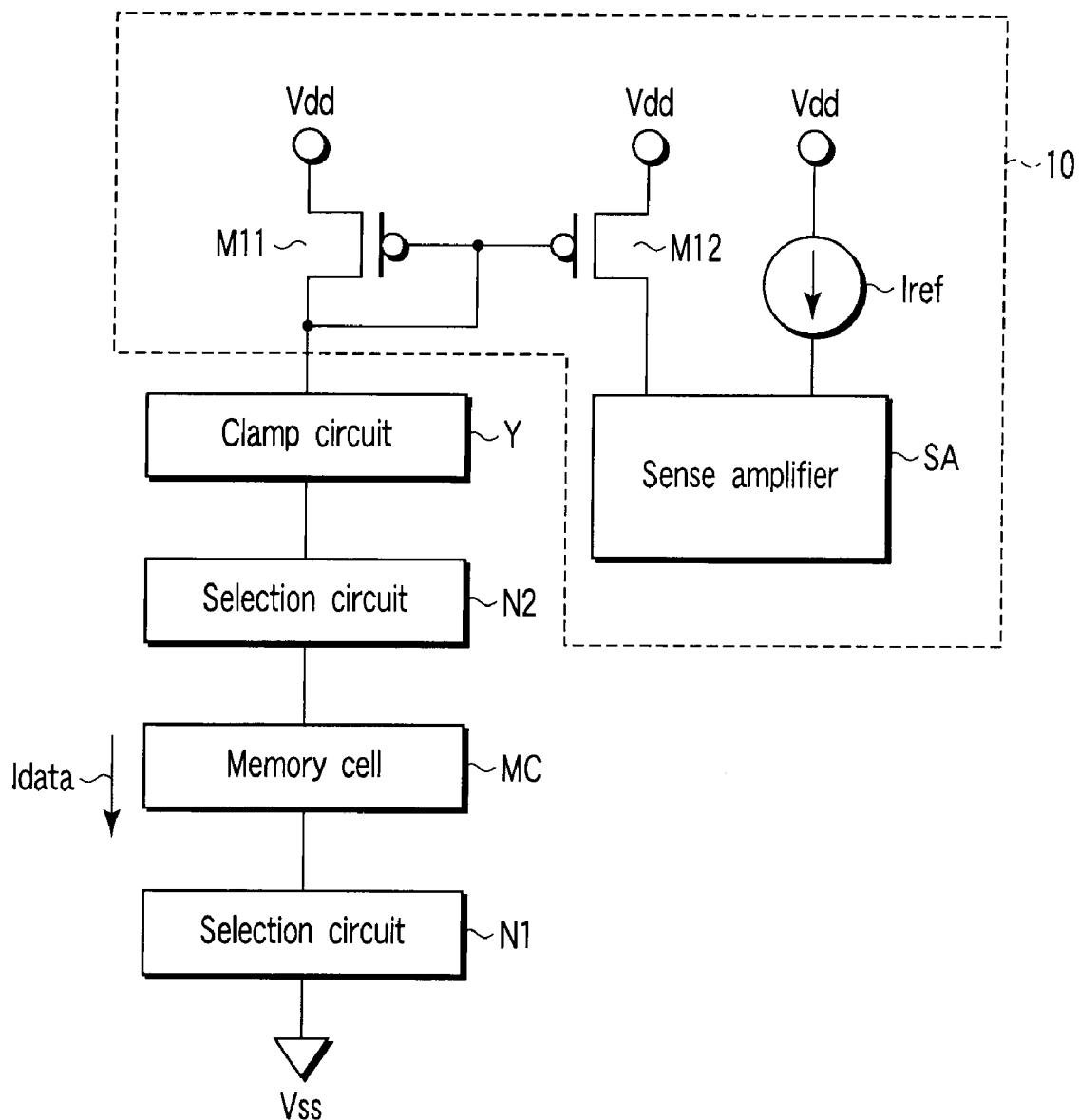
F I G. 1

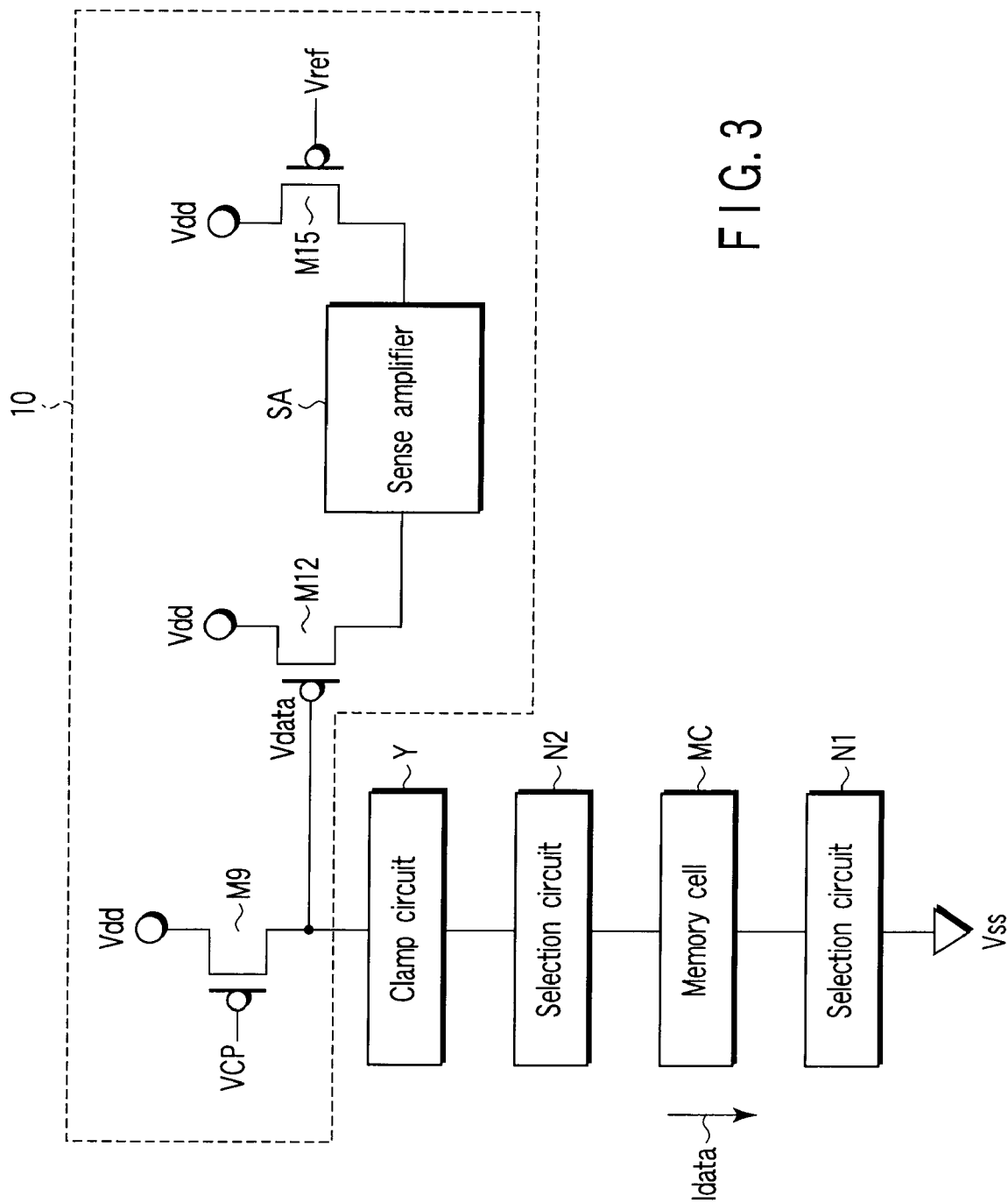
F I G. 3

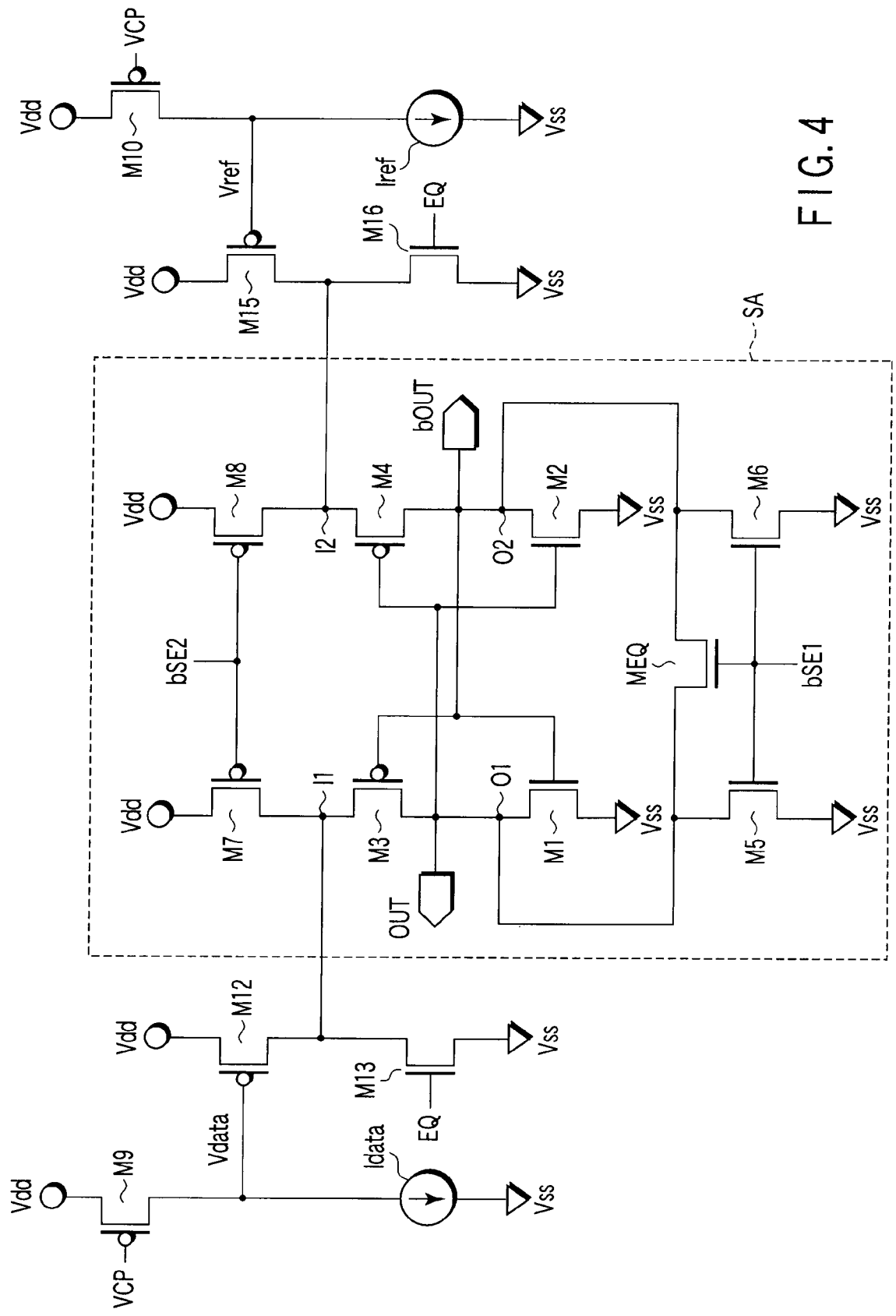
F I G. 4

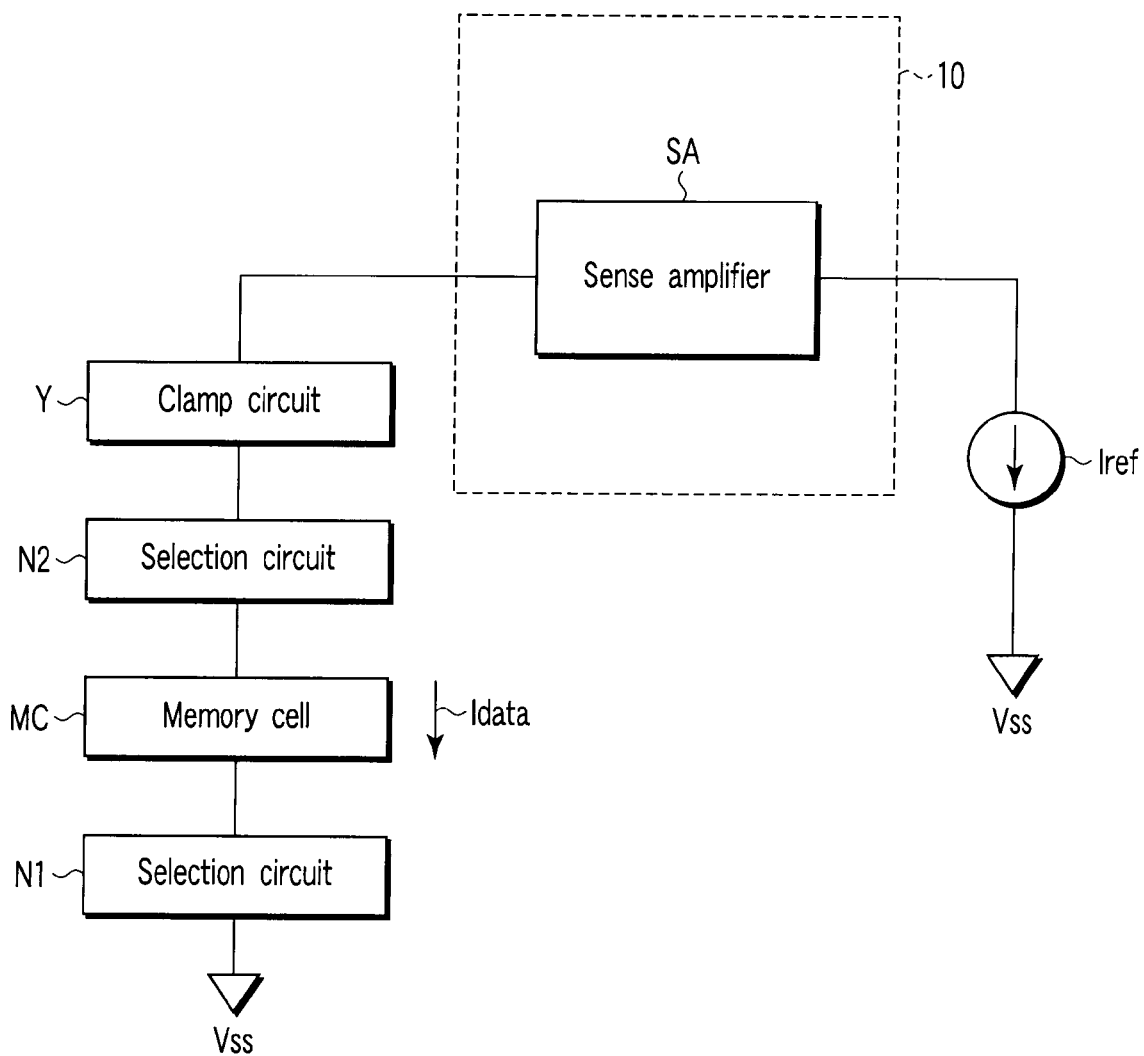
F I G. 6

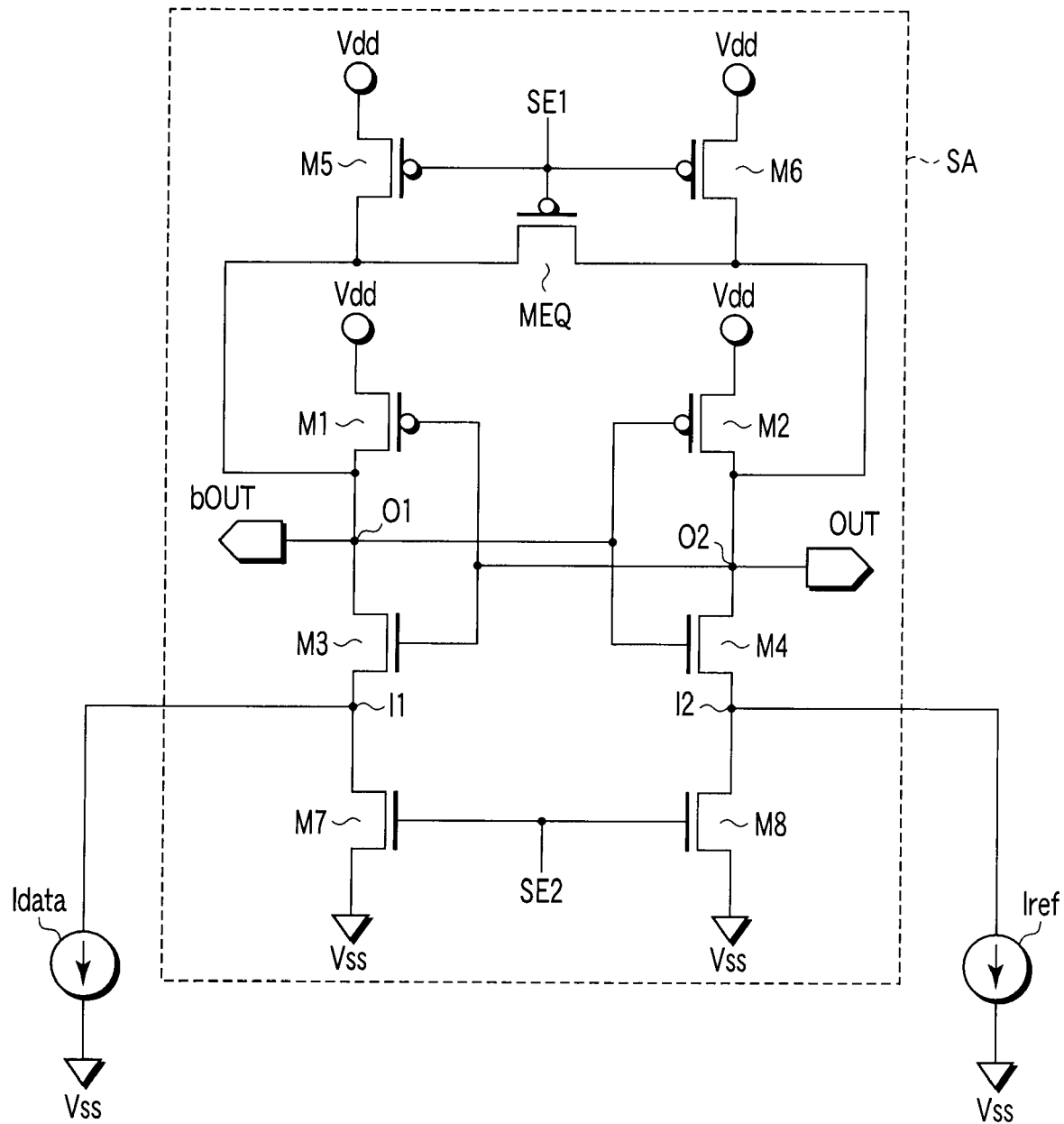
F I G. 7

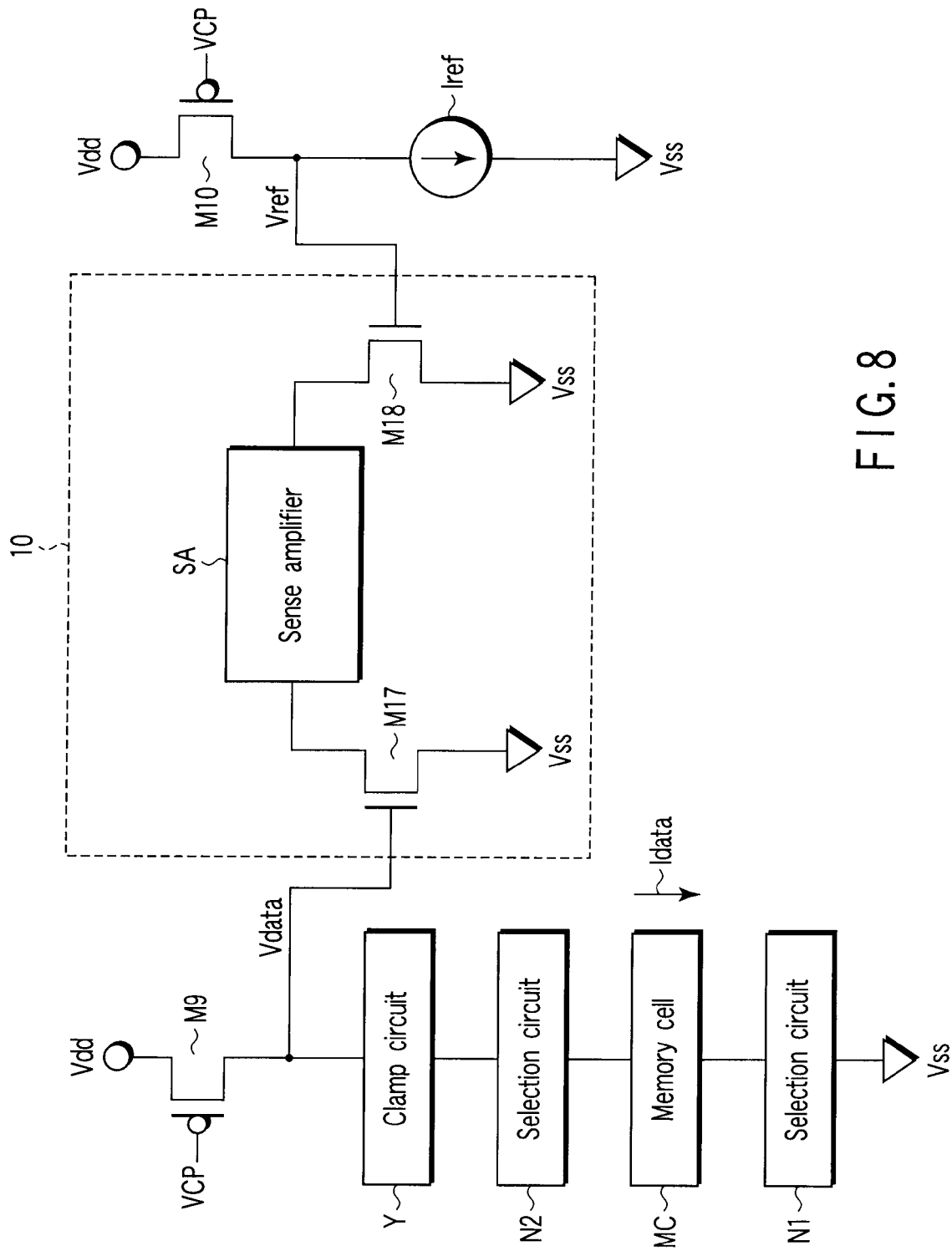
F I G. 8

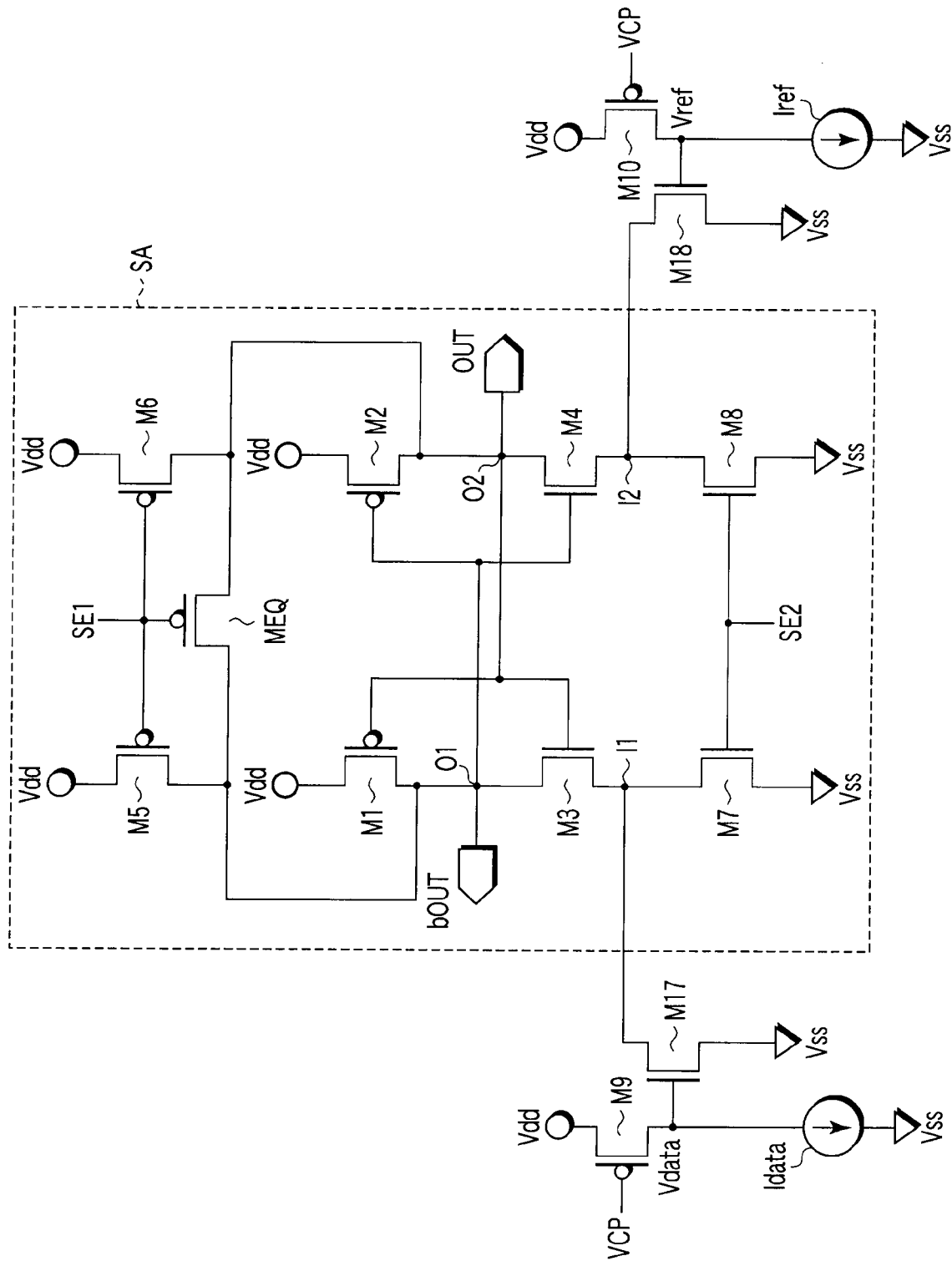
F I G. 9

SENSE AMPLIFIER

CROSS-REFERENCE TO RELATED APPLICATIONS

This application is based upon and claims the benefit of priority from prior Japanese Patent Application No. 2006-150554, filed May 30, 2006, the entire contents of which are incorporated herein by reference.

BACKGROUND OF THE INVENTION

1. Field of the Invention

The present invention relates to a sense amplifier, for instance, which is used for a semiconductor memory having a resistance change element as a memory cell.

2. Description of the Related Art

A magnetic random access memory (MRAM) is one of semiconductor memories having a resistance change element as a memory cell.

As for write of the magnetic random access memory, there are known two systems of a magnetic field write system utilizing a magnetic field generated by a write current, and a spin injection write system utilizing a spin torque by spin-polarized electrons.

The spin injection write system is widely noticed as an effective technique for realizing a large capacity of the magnetic random access memory (for instance, refer to U.S. Pat. No. 5,695,864).

Its characteristic lies in a point that magnetization of a magnetic element of nano scale is directly controlled by the spin-polarized electrons. That is, in the magnetic field write system, a problem of a wrong write of a non-selected cell caused by spread of a magnetic field is generated, while in the spin injection write system, such a problem is not generated. Further, based on a characteristic that the smaller the size of the magnetic element becomes, the smaller the value of the spin injection current necessary for magnetization reversal becomes, the spin injection write system is advantageous for high integration, low power consumption and high performance.

However, in the spin injection write system, since a read current becomes a minute value, it becomes necessary for the spin injection write system to develop technique to sense a minute current difference at high speed.

Specifically, in this system, although the spin injection current is caused to flow into a magnetoresistive element directly, direction of this spin injection current should be changed in accordance with a value of write data. That is, the read current invariably has the same direction as the spin injection current flowing into one direction. Thus, in order not to destroy the data at the time of reading, the read current should be made substantially smaller than the spin injection current.

However, when making the read current small, naturally, the current difference in the read current in accordance with states "1", "0" of a magnetoresistive element also becomes small. That the current difference becomes small means a time to sense it becomes long. That sensing time becomes long means a time during which the read current is caused to flow continuously becomes long. Such long-time continuous flowing out of the read current increases a current consumption at the time of reading, and enhances a magnetic reversal probability of the magnetoresistive element, thereby generating a problem of data destruction.

Study of a sense amplifier which is to sense a minute current difference at high speed and thus suitable for such a use is performed.

For instance, in Jpn. Pat. Appln. KOKAI Publication No. 2005-285161, there is disclosed a technique that a MOSFET for strengthening a charge of two output nodes of a sense amplifier is turned on at the same time of start of a sense operation. However, in this technique, there is a problem that since the strengthening of the charge is performed before the time point sensing of the minute current difference is performed enough, the minute current difference is erroneously detected. In particular, in the case where there is variations in charging performance between the two output nodes of the sense amplifier, the variations make the minute current difference further small to generate erroneous operation of the sense amplifier.

Further, in Travis N. Blalock et al., "A High-Speed Clamped Bit-Line Current-Mode Sense Amplifier," IEEE J. Solid State Circuits, April 1991, vol, 26, pp. 542-548, there is disclosed a technique in which the quasi-stable state of the latch is destroyed while converting the minute current difference between the cell current and the reference current into the potential difference by releasing equalizing of two output nodes of the sense amplifier at the same time as start of the sense operation. However, in this technique, there is the problem that since the potential difference generated by the minute current difference is also minute, the sense operation becomes difficult.

BRIEF SUMMARY OF THE INVENTION

A sense amplifier according to a first aspect of the present invention comprises a first FET of a first conductive type in which a drain is connected to a first output node, a gate is connected to a second output node, and a source is connected to a first power source node, a second FET of a first conductive type in which a drain is connected to the second output node, a gate is connected to the first output node, and a source is connected to the first power source node, a third FET of a second conductive type in which a drain is connected to the first output node, a gate is connected to the second output node, and a source is connected to a first input node, a fourth FET of a second conductive type in which a drain is connected to the second output node, a gate is connected to the first output node, and a source is connected to a second input node, a fifth FET of a second conductive type in which a drain is connected to the first input node, and a source is connected to a second power source node, and a sixth FET of a second conductive type in which a drain is connected to the second input node, and a source is connected to the second power source node. The sense operation is started by charging or discharging the first output node from the first input node with a first current and by charging or discharging the second output node from the second input node with a second current, and the fifth and sixth FETs are turned on after starting the sense operation.

A semiconductor memory according to a second aspect of the present invention comprises a memory cell and a reference cell comprised resistance change elements, a first bit line connected to one end of the memory cell, a second bit line connected to one end of the reference cell, a clamp circuit which fixes voltages of the first and second bit lines into a constant value at the time of reading, and the sense amplifier according to the first example of the present invention. The first bit line is connected to the first input node according to the first example of the present invention, and the second bit line is connected to the second input node according to the first example of the present invention.

BRIEF DESCRIPTION OF THE SEVERAL VIEWS OF THE DRAWING

FIG. 1 is a view showing a semiconductor memory as a first embodiment;

FIG. 3 is a view showing a semiconductor memory as a modified example of the first embodiment;

FIG. 4 is a circuit diagram showing a sense amplifier as a modified example of the first embodiment;

FIG. 6 is a view showing a semiconductor memory as a second embodiment;

FIG. 7 is a circuit diagram showing a sense amplifier as the second embodiment;

FIG. 8 is a view showing a semiconductor memory as a modified example of the second embodiment;

FIG. 9 is a circuit diagram showing a sense amplifier as a modified example of the second embodiment;

DETAILED DESCRIPTION OF THE INVENTION

A sense amplifier of an aspect of the present invention will be described below in detail with reference to the accompanying drawings.

1. OUTLINE

A characteristic of a sense amplifier according to an example of the present invention lies in a point that charge or discharge of first and second output nodes is strengthened while using third and fourth currents, after starting a sense operation, that is, after starting the charge or the discharge of the first and second output nodes by using first and second currents having minute current difference.

According to such constitution, it is possible to realize high speed sense operation by the third and fourth currents.

Note that, if a driving current of a field effect transistor (FET) generating the third and fourth currents is made larger than a driving current of FET generating the first and second currents, realization of the high-speed sense operation becomes further noticeable.

2. EMBODIMENTS

Next, there will be described embodiments of the present invention.

(1) First Embodiment

FIG. 1 shows a read circuit of a semiconductor memory.

At the time of data read, a memory cell MC is selected by selection circuits N1, N2, and electrically connected between power source terminals $V_{dd}$, $V_{ss}$. A cell current (read current) $I_{data}$ flows into the memory cell MC corresponding to a data value stored in the memory cell MC.

The cell current $I_{data}$ is transferred to an input node of a sense amplifier SA by a current mirror circuit comprised P-channel MOSFETs M11, M12 in the read circuit 10, and charges one of the two output nodes in the sense amplifier SA.

Further, a reference current $I_{ref}$ is input into the sense amplifier SA. The reference current $I_{ref}$ is, for instance, generated by a reference cell. A value of the reference current $I_{ref}$ is set to an intermediate value between a cell current of the memory cell storing "0" and a cell current of the memory cell storing "1".

The reference current $I_{ref}$ charges the other one of the two output nodes in the sense amplifier SA.

A clamp circuit Y is a circuit which forces, at the time of data read, a voltage of a bit line at the sense amplifier SA of the memory cell MC to maintain a predetermined value (for instance 0.1 to 0.6V). The clamp circuit Y is effective in the case where, for instance, the memory cell MC is a magnetoresistive element.

Figure 2:
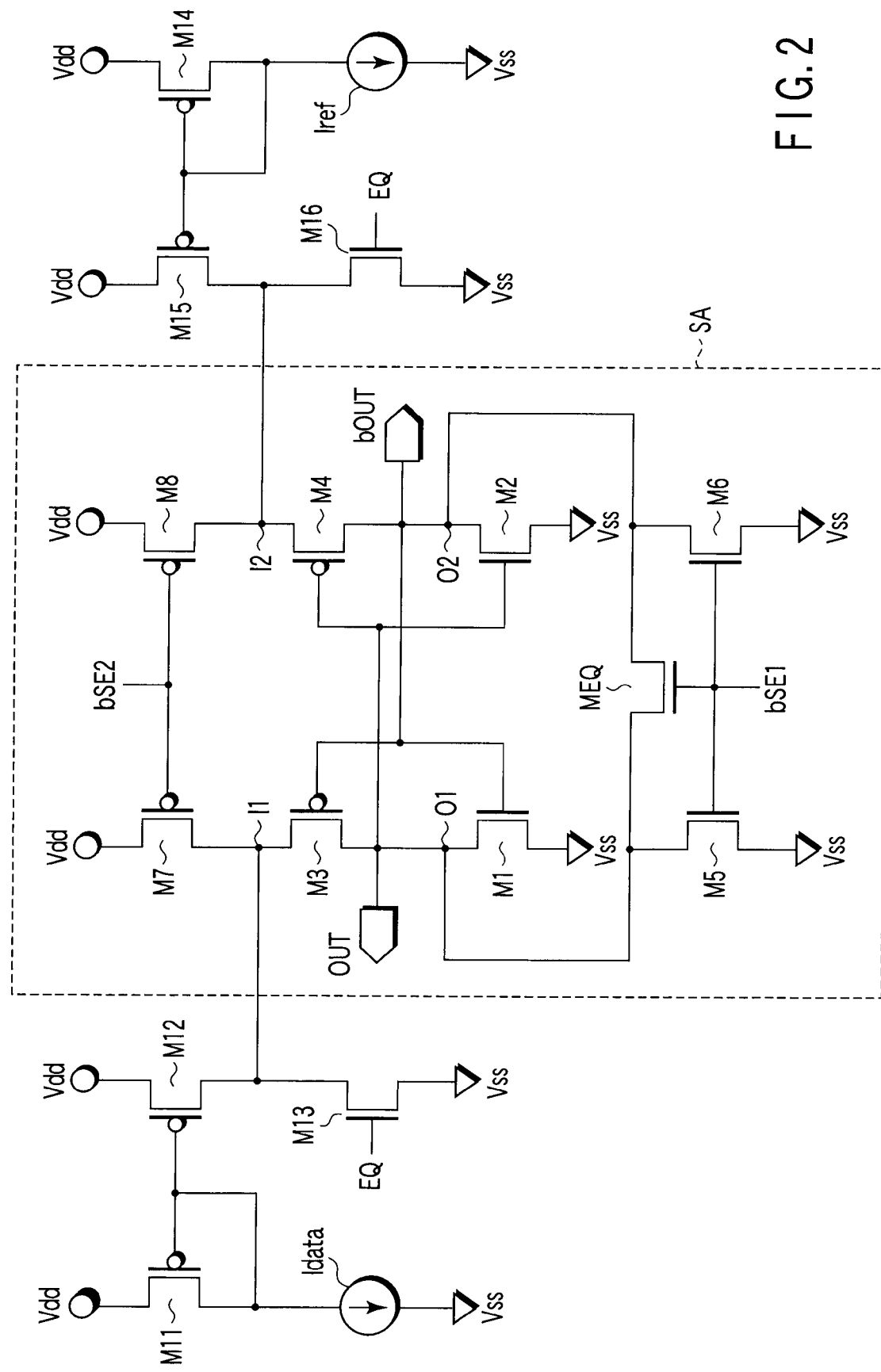
FIG. 2 is a circuit diagram showing a sense amplifier as the first embodiment.

FIG. 2 shows the sense amplifier of FIG. 1.

This sense amplifier SA is a current differential sense amplifier.

A main body is comprised a flip-flop circuit (latch) comprised N-channel MOSFETs M1, M2 and P-channel MOSFETs M3, M4.

A drain of the N-channel MOSFET M1 is connected to an output node O1, a gate thereof is connected to an output node O2, and a source thereof is connected to a power source node $V_{SS}$. Further, a drain of the N-channel MOSFET M2 is connected to the output node O2, a gate thereof is connected to the output node O1, and a source thereof is connected to the power source $V_{SS}$.

A drain of the P-channel MOSFET M3 is connected to the output node O1, a gate thereof is connected to the output node O2, and a source thereof is connected to an input node I1. Further, a drain of the P-channel MOSFET M4 is connected to the output node O2, a gate thereof is connected to the output node O1, and a source thereof is connected to an input node I2.

A circuit, which short-circuits the output nodes O1, O2 to the power source node (ground point) $V_{ss}$ and equalizes voltages of the output nodes O1, O2 before starting the sense operation, is connected to the output nodes O1, O2 of the main body. In the present example, the output nodes O1, O2 are short-circuited to the power source node $V_{ss}$ by the N-channel MOSFETs M5, M6, and voltages of the output nodes O1, O2 are equalized by an N-channel MOSFET MEQ.

N-channel MOSFETs M13, M16 are for short-circuiting the input nodes I1, I2 to the power source node $V_{ss}$ before starting the sense operation. At the time of starting the sense operation, EQ is changed from high to low.

P-channel MOSFETs M7, M8 connected to the input nodes I1, I2 are feature parts of this sense amplifier SA, turned on after starting the sense operation, and have a function for accelerating the sense operation.

The sense operation is started in such a way that bSE1 is changed from high to low and the N-channel MOSFETs M5, M6 and MEQ are turned off.

The cell current $I_{data}$ is transferred to the input node I1 by the current mirror circuit comprised the P-channel MOSFETs M11, M12, and charges the output node O1. Similarly, the reference current $I_{ref}$ is transferred to the input node I2 by the current mirror circuit comprised the P-channel MOSFETs M14, M15, and charges the output node O2.

After that, bSE2 is changed from high to low, and the P-channel MOSFETs M7, M8 are turned on.

High speed sensing is realized without problems of wrong read caused by variations of characteristic of the P-channel MOSFETs M7, M8 as described in the reference example, in such a way that a timing to turn on the P-channel MOSFETs M7, M8 is changed from the time point the sense operation is started to the time point after starting the sense operation.

FIG. 3 shows a modified example of the read circuit of FIG. 1.

A characteristic of the modified example lies in a point that a read voltage $V_{data}$ obtained by flowing the read current $I_{data}$ from P-channel MOSFET M9 to the memory cell MC is introduced to the sense amplifier SA, after further converting the read voltage $V_{data}$ into a current by the P-channel MOSFET M12. Also the reference voltage $V_{ref}$ is introduced to the sense amplifier SA, after converting the reference voltage $V_{ref}$ into a current by the P-channel MOSFET M15.

FIG. 4 shows the sense amplifier of FIG. 3.

The sense amplifier SA is the same as that of FIG. 2.

The read voltage $V_{data}$ is converted into a current, after being inputted to the gate of the P-channel MOSFET M12. The current flowing through the P-channel MOSFET M12 charges the output node O1 of the sense amplifier SA. The reference voltage $V_{ref}$ is converted into a current, after being inputted to the gate of the P-channel MOSFET M15. The current flowing through the P-channel MOSFET M15 charges the output node O2 of the sense amplifier SA.

Figure 5:
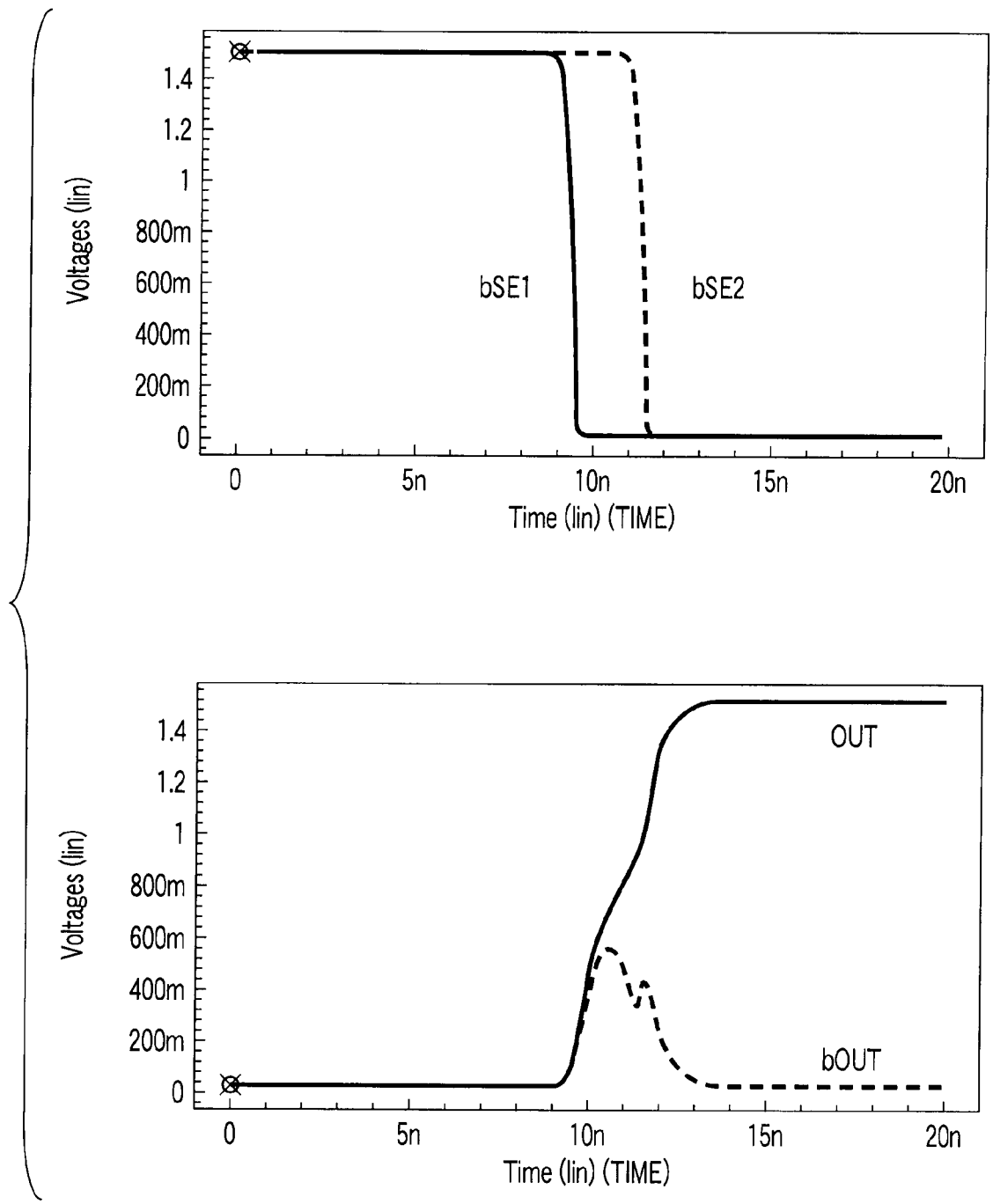
FIG. 5 is a waveform diagram showing an operation waveform of the sense amplifier of FIGS. 2 and 4.

FIG. 5 shows an operation waveform of the sense amplifier according to the first embodiment.

In a state before starting the sense operation, both bSE1 and bSE2 are high (power source voltage $V_{dd}$). At this time point, the N-channel MOSFETs M5, M6 and MEQ are on, and the P-channel MOSFETs M7, M8 are off in FIGS. 2 and 4.

Accordingly, both output signals OUT, bOUT are low. Even if a current is supplied to the input nodes I1, I2, the output nodes O1, O2 are kept at the power source voltage (ground voltage) $V_{ss}$ or in the vicinity thereof by the N-channel MOSFETs M5, M6.

Before starting sense operation, initial voltages of the output nodes O1, O2 are made identical forcibly by the N-channel MOSFET MEQ.

After that, the sense operation is started by switching the bSE1 from high to low. That is, when the bSE1 becomes low, the N-channel MOSFETs M5, M6 and MEQ are turned off, so that a current (minute current difference) is poured into the output nodes O1, O2 from the P-channel MOSFETs M12, M15.

The output nodes O1, O2 are respectively charged, the output signals OUT, bOUT increase gradually, and difference between the both is enlarged gradually.

In the initial state, since the output signals OUT, bOUT are the power source voltage (ground voltage) $V_{ss}$ or in the vicinity thereof, both the N-channel MOSFETs M1, M2 are off, and both the P-channel MOSFETs M3, M4 are on.

When the output signals OUT, bOUT increase, and exceed one threshold voltage of the N-channel MOSFETs M1, M2, latch operation is started, so that difference between the output signals OUT and bOUT is enlarged rapidly.

In the present example, since the N-channel MOSFET M1 turns off and the P-channel MOSFET M4 turns off, the output signal OUT further increases, and the output signal bOUT turns to descent from ascent.

Here, concerning one which is finally determined as high between the output signals OUT, bOUT, in a state after the latch operation is started, the driving current of the N-channel MOSFETs M12, M15 is set small. Thus, it takes considerable time to reach high (power source voltage $V_{dd}$).

Accordingly, when difference between the output signals OUT, bOUT increases sufficiently, for instance, at the time point the latch operation is started or after the latch operation is started, bSE2 is changed from high to low, followed by turning the P-channel MOSFETs M7, M8 on, and thereby charging performance of the output nodes O1, O2 is strengthened.

It may be judged whether or not difference between the output signals OUT, bOUT increases sufficiently, for instance, by voltage difference between the output signals OUT, bOUT. For instance, if its voltage difference exceeds 100 mV, it is judged that difference between the output signals OUT, bOUT increases sufficiently.

Concerning one which is finally determined as high between the output signals OUT, bOUT, since increasing speed of the voltage is improved by this charge, the time until reaching high (power source voltage $V_{dd}$) becomes short, thereby realizing high-speed sensing.

Note that, in a state after the latch operation is started and bSE2 becomes low, even though the charge for the output nodes O1, O2 from the P-channel MOSFETs M12, M15 is stopped, the latch operation is maintained, and thus one of the output signals OUT, bOUT is finally determined as high, while the other one is determined as low.

Further, when the drive current of the P-channel MOSFETs M7, M8 is made larger than the drive current of the P-channel MOSFETs M12, M15, a time from starting the sense operation to completion thereof further becomes short.

As described above, according to the first embodiment, it becomes possible to sense minute current difference at high speed.

(2) Second Embodiment

FIG. 6 shows a read circuit of a semiconductor memory.

At the time of data read, a memory cell MC is selected by selection circuits N1, N2, and electrically connected between power source terminals $V_{dd}$, $V_{ss}$. A cell current (read current) $I_{data}$ flows into the memory cell MC corresponding to a data value stored in the memory cell MC. The cell current $I_{data}$ discharges one of two output nodes in a cell amplifier SA in a read circuit 10.

Further, the reference current $I_{ref}$ discharges the other one of the two output nodes in the sense amplifier SA. The reference current $I_{ref}$ is, for instance, generated by a reference cell. A value of the reference current $I_{ref}$ is set to an intermediate value between a cell current of the memory cell storing "0" and a cell current of a memory cell storing "1".

A clamp circuit Y is a circuit which forces, at the time of data read, a voltage of a bit line at the sense amplifier SA of the memory cell MC to maintain a predetermined value (for instance 0.1 to 0.6V). The clamp circuit Y is, as described in the first embodiment, effective in the case where, for instance, the memory cell is a magnetoresistive element.

FIG. 7 shows the sense amplifier of FIG. 6.

This sense amplifier SA is a current differential sense amplifier.

A main body is comprised a flip-flop circuit (latch) comprised N-channel MOSFETs M1, M2 and P-channel MOSFETs M3, M4.

A drain of the P-channel MOSFET M1 is connected to an output node O1, a gate thereof is connected to an output node O2, and a source thereof is connected to a power source node $V_{dd}$. Further, a drain of the P-channel MOSFET M2 is connected to the output node O2, a gate thereof is connected to the output node O1, and a source thereof is connected to the power source node $V_{dd}$.

A drain of the N-channel MOSFET M3 is connected to the output node O1, a gate thereof is connected to the output node O2, and a source thereof is connected to an input node I1. Further, a drain of the N-channel MOSFET M4 is connected to the output node O2, a gate thereof is connected to the output node O1, and a source thereof is connected to an input node I2.

A circuit, which short-circuits the output nodes O1, O2 to the power source node $V_{dd}$ and equalizes voltages of the output nodes O1, O2 before starting the sense operation, is connected to the output nodes O1, O2 of the main body. In the present example, the output nodes O1, O2 are short-circuited to the power source node $V_{dd}$ by the P-channel MOSFETs M5, M6, and voltages of the output nodes O1, O2 are equalized by the P-channel MOSFET MEQ.

N-channel MOSFETs M7, M8 connected to the input nodes I1, I2 are feature parts of this sense amplifier SA, turned on after starting the sense operation, and have a function for accelerating the sense operation.

The sense operation is started by changing SE1 from low to high and turning the P-channel MOSFETs M5, M6 and MEQ off. The cell current $I_{data}$ discharges the output node O1 of the sense amplifier SA. Similarly, the reference current $I_{ref}$ discharges the output node O2 of the sense amplifier SA.

After that, SE2 is changed from low to high and the N-channel MOSFETs M7, M8 are turned on.

High speed sensing is realized without problems of wrong read caused by variations of characteristic of the N-channel MOSFETs M7, M8 as described in the reference example, in such a way that a timing for turning the N-channel MOSFETs M7, M8 on is changed from the time point the sense operation is started to the time point after starting the sense operation.

FIG. 8 shows a modified example of a read circuit of FIG. 6.

A characteristic of the modified example lies in a point that a read voltage $V_{data}$ obtained by flowing the read current $I_{data}$ from P-channel MOSFET M9 to the memory cell MC is introduced to the sense amplifier SA, after further converting the read voltage $V_{data}$ into a current by an N-channel MOSFET M17. Also the reference voltage $V_{ref}$ is introduced to the sense amplifier SA, after converting the reference voltage $V_{ref}$ into a current by an N-channel MOSFET M18.

FIG. 9 shows the sense amplifier of FIG. 8.

The sense amplifier SA is the same as that of FIG. 7.

The read voltage $V_{data}$ is converted into current after being inputted to the gate of the N-channel MOSFET M17. The current flowing through the N-channel MOSFET M17 discharges the output node O1 of the sense amplifier SA. The reference voltage $V_{ref}$ is converted into current after being inputted to the gate of the N-channel MOSFET M18. The current flowing through the N-channel MOSFET M18 discharges the output node O2 of the sense amplifier SA.

Figure 10:
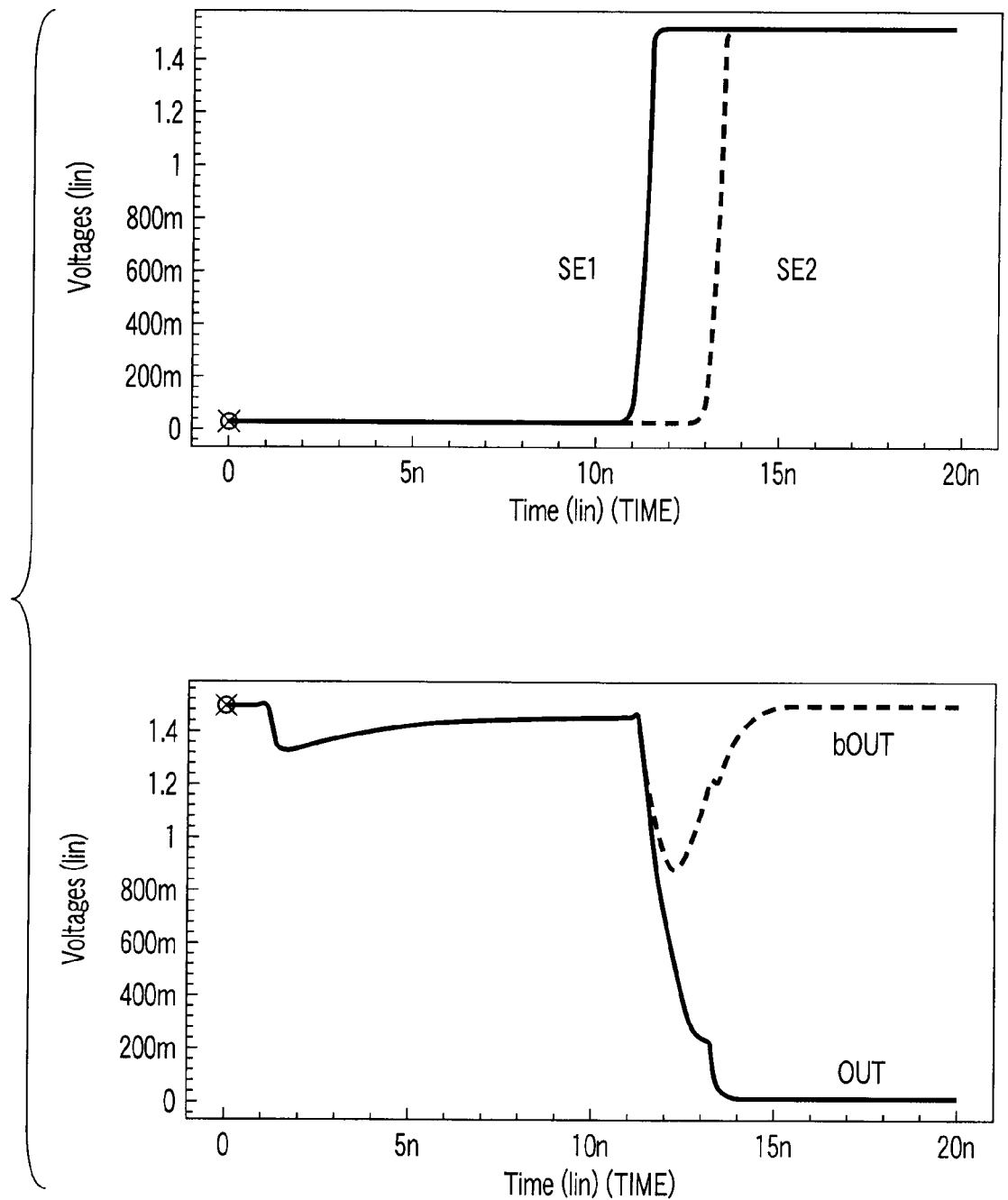
FIG. 10 is a waveform diagram showing an operation waveform of the sense amplifier of FIGS. 7 and 9.

FIG. 10 shows an operation waveform of the sense amplifier according to the second embodiment.

In a state before starting the sense operation, both SE1 and SE2 are low (ground voltage $V_{ss}$). At this time point, in FIGS. 7 and 9, the P-channel MOSFETs M5, M6 and MEQ are on, and the N-channel MOSFETs M7, M8 are off.

Accordingly, both the output signals OUT, bOUT are high. The output nodes O1, O2 are maintained in the source voltage $V_{dd}$ or in the vicinity thereof by the N-channel MOSFETs M5, M6 and MEQ.

After that, the sense operation is started upon changing SE1 from low to high. That is, SE1 becomes high, so that the P-channel MOSFETs M5, M6 and MEQ are turned off, with the result that the output nodes O1, O2 are discharged by the cell current $I_{data}$ and the reference current $I_{ref}$ having minute current difference.

As a result, the output signals OUT, bOUT descend gradually, and also difference between the both is enlarged gradually.

In the initial state, since the output signals OUT, bOUT are the power source voltage $V_{dd}$ or in the vicinity thereof, both the P-channel MOSFETs M1, M2 are off, and both the N-channel MOSFETs M3, M4 are on.

When the output signals OUT, bOUT descend, and are below one threshold voltage of the P-channel MOSFETs M1, M2, latch operation is started, so that difference between the output signals OUT and bOUT is enlarged rapidly.

In the present example, since the P-channel MOSFET M2 turns off and the N-channel MOSFET M3 turns off, the output signal OUT further descends, and the output signal bOUT turns to ascent from descent.

Here, concerning one which is finally determined as low between the output signals OUT, bOUT, in a state after the latch operation is started, the cell current $I_{data}$ and the reference current $I_{ref}$ are small. Thus, it takes considerable time to reach low (ground voltage $V_{ss}$).

Accordingly, when difference between the output signals OUT, bOUT increases sufficiently, for instance, at the time point the latch operation is started or after the latch operation is started, SE2 is changed from low to high, followed by turning the N-channel MOSFETs M7, M8 on, and thereby discharging performance of the output nodes O1, O2 is strengthened.

It may be judged whether or not difference between the output signals OUT, bOUT increases sufficiently, for instance, by voltage difference between the output signals OUT, bOUT. For instance, if its voltage difference exceeds 100 mV, it is judged that difference between the output signals OUT, bOUT is sufficient.

Concerning one which is finally determined as low between the output signals OUT, bOUT, since descent speed of the voltage is improved by this discharge, a time until reaching low (ground voltage $V_{ss}$) becomes short, thereby realizing high-speed sensing.

Note that, in a state where the output signals OUT, bOUT are finally determined as high or low based on the latch operation, since the P-channel MOSFET M2 is off and the N-channel MOSFET M3 is off, the cell current $I_{data}$ and the reference current $I_{ref}$ are automatically stopped.

Further, when the drive current of the N-channel MOSFETs M7, M8 is made larger than the cell current $I_{data}$ or the reference current $I_{ref}$, a time from starting the sense operation to completion thereof further becomes short.

As described above, also in the second embodiment, it becomes possible to sense minute current difference at high speed.

3. APPLICATION EXAMPLE

Hereinafter, there will be described the case where the sense amplifier according to the example of the present invention is applied to a magnetic random access memory.

Figure 11:
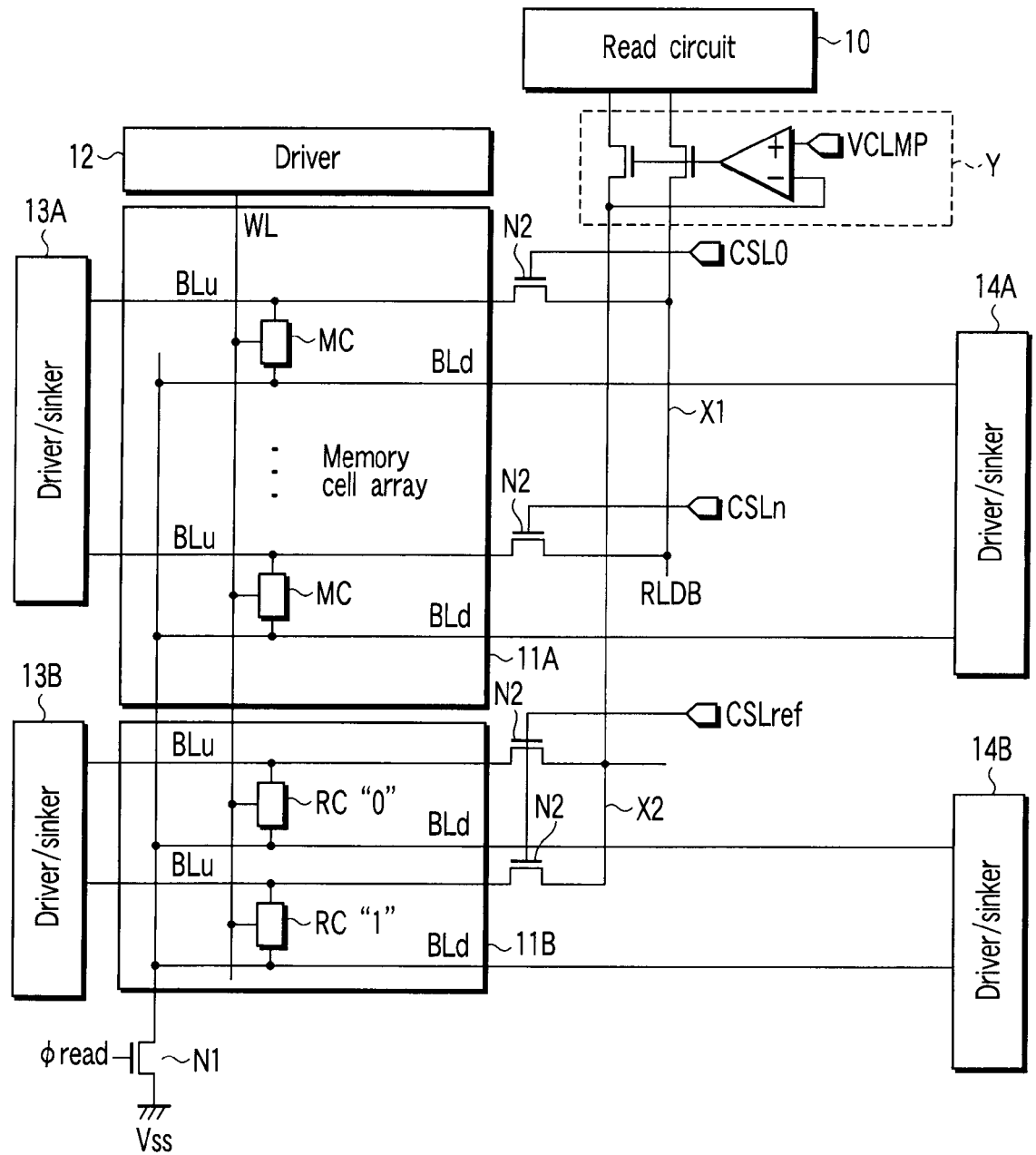
FIG. 11 is a view showing a magnetic random access memory as an application example.

FIG. 11 shows a first example of a spin injection write type magnetic random access memory.

A memory cell array 11A is comprised a plurality of memory cells MC, and a reference cell array 11B is comprised a plurality of reference cells RC.

A word line WL is connected to a driver 12, and connected to the memory cell MC and the reference cell RC in one row.

In the memory cell array 11A, a bit line BLu is connected to a driver/sinker 13A and connected to one end of the memory cell MC in one column. A bit line BLd is connected to a driver/sinker 14A and to the other end of the memory cell MC in one column.

The bit line BLu is further connected to a common node X1 via an N-channel MOSFET (switching element) N2 as a selection circuit for selecting a column.

In the reference cell array 11B, the bit line BLu is connected to a driver/sinker 13B and connected to one end of the memory cell MC in one column. The bit line BLd is connected to a driver/sinker 14B and to the other end of the memory cell MC in one column.

The bit line BLu is connected to a common node X2 via the N-channel MOSFET (switching element) N2 as the selection circuit.

Column selection signals $CSL0, \ldots CSLn, CSL_{ref}$ are inputted to a gate of an N-channel MOSFET N1.

The bit line BLd is connected to a power source node (ground point) $V_{ss}$ via the N-channel MOSFET (switching element) N1 as the selection circuit. At the time of reading, a control signal $\phi_{read}$ becomes high, and the N-channel MOSFET N1 is turned on.

At the time of write, all of the N-channel MOSFETs N1, N2 as the selection circuits turn off. Then, write current with direction in accordance with a write data is caused to flow through the memory cell MC or the reference cell RC while using the driver/sinkers 13A, 13B, 14A and 14B.

The respective common nodes X1, X2 are connected to the sense amplifier SA via a clamp circuit Y. The clamp circuit Y forces the voltage of the bit line BLu to maintain a predetermined value (for instance, 0.1 to 0.6V).

As the sense amplifier in the read circuit 10, the sense amplifier according to the first embodiment is used.

Figure 12:
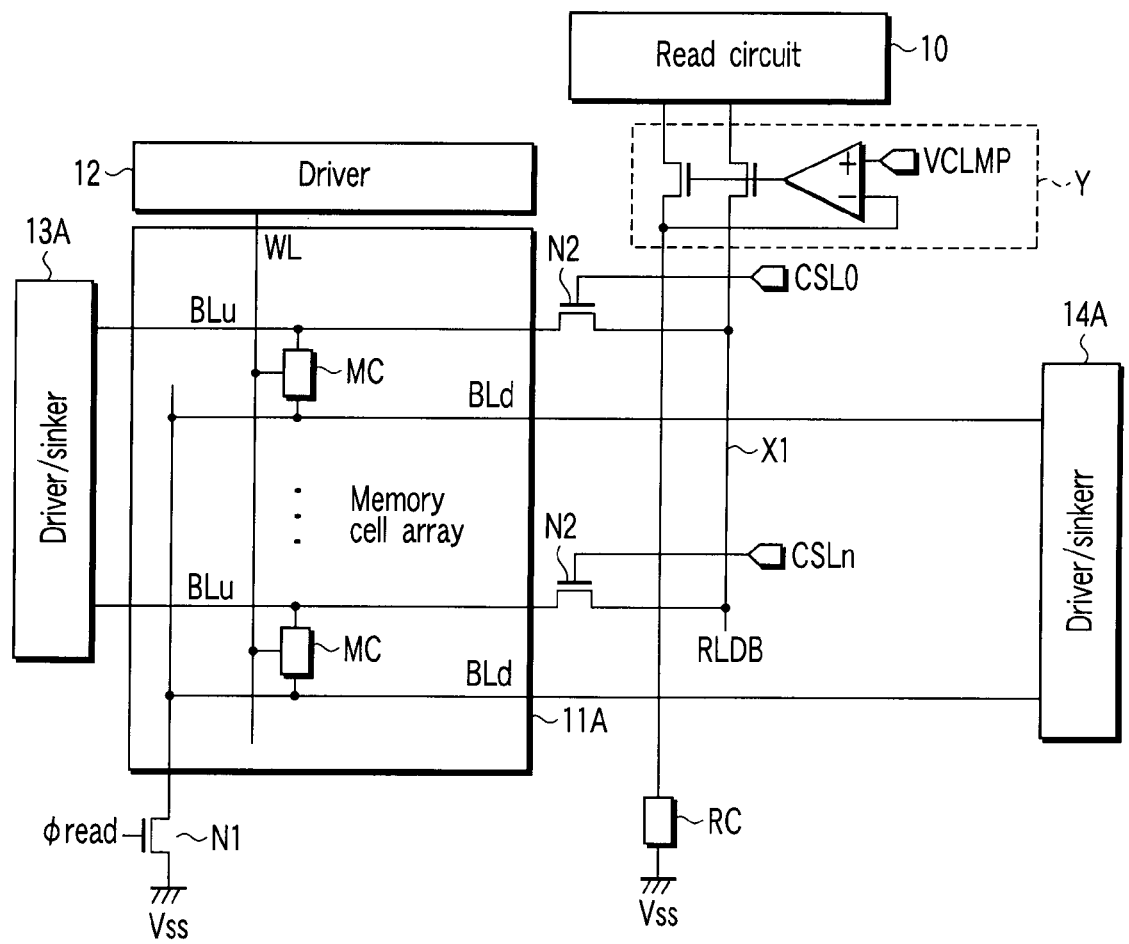
FIG. 12 is a view showing the magnetic random access memory as an application example.

FIG. 12 shows a second example of the spin injection write type magnetic random access memory.

The second example of the magnetic random access memory has a characteristic in a point that there is provided a single reference cell RC having an intermediate resistance value between the "0" state memory cell MC and the "1" state memory cell. The reference cell RC generates the reference current serving as a reference for judging the data of the memory cell MC.

In this case, as the sense amplifier in the read circuit 10, the sense amplifier according to the first or second embodiment is used.

Figure 13:
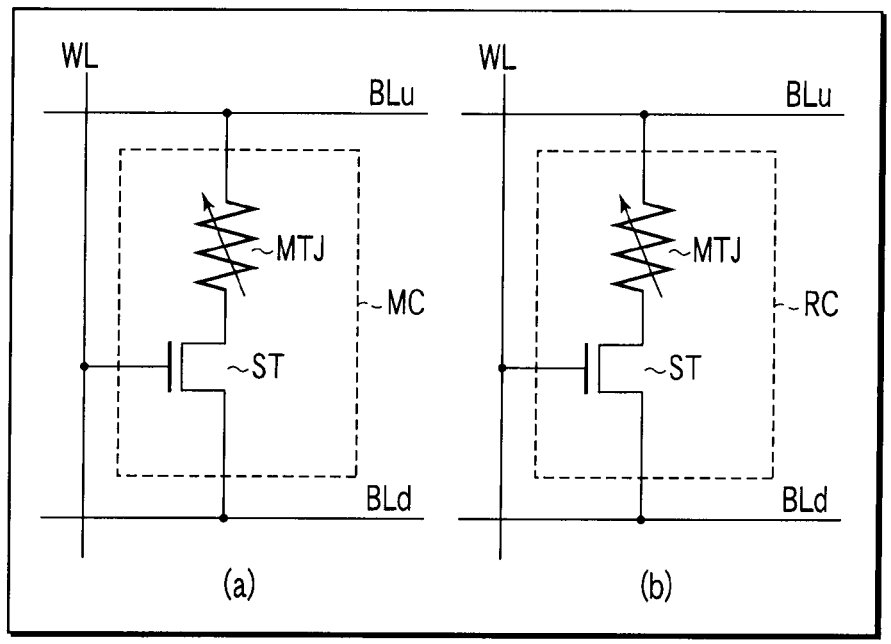
FIG. 13 is a circuit diagram showing an example of a memory cell and a reference cell.

FIG. 13 shows the example of the memory cell and the reference cell.

Both the memory cell MC and the reference cell RC are comprised a magnetoresistive element (MTJ element) MTJ and an N-channel MOSFET ST connected serially between the bit lines BLu, BLd.

Figure 14:
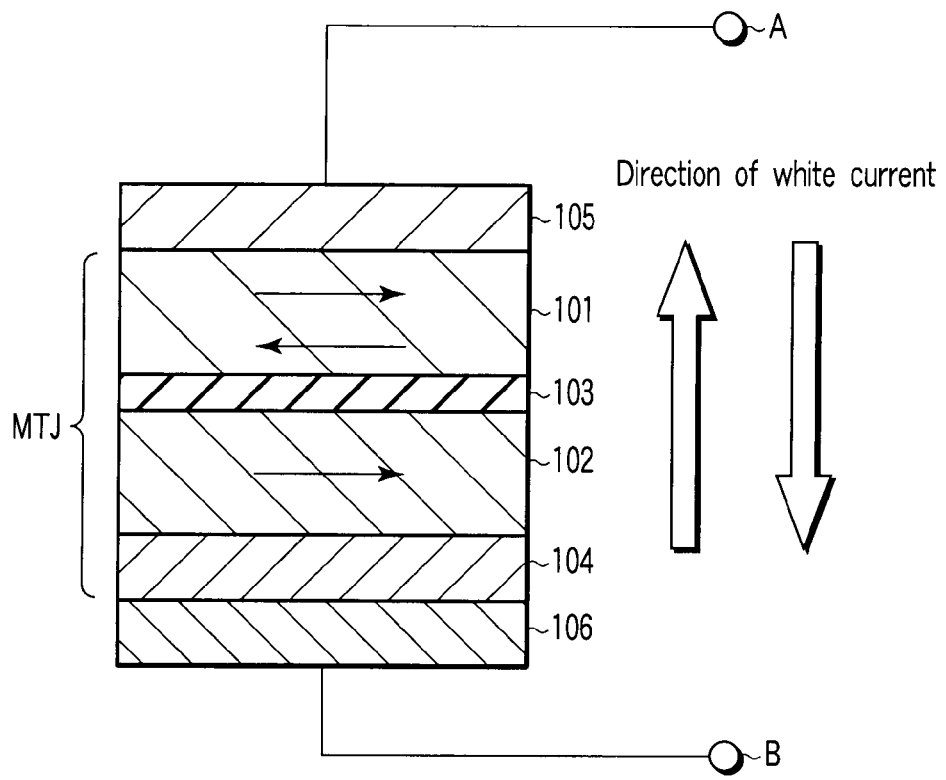
FIG. 14 is a cross sectional view showing an example of a magnetoresistive element.

The magnetoresistive element MTJ, for instance, as shown in FIG. 14, is comprised a free layer (magnetic recording layer) 101 whose magnetization direction is variable, a pinned layer (magnetization adhering layer) 102 whose magnetization direction is fixed, and a non-magnetic layer 103 therebetween. The magnetization direction of the pinned layer 102 is fixed by, for instance, an antiferromagnetic layer 104. The magnetoresistive element MTJ is sandwiched by electrodes 105, 106.

The free layer 101 and the pinned layer 102 may be constituted by a laminate of a plurality of ferromagnetic layers or may have a synthetic anti-ferromagnetic (SAF) structure.

A lower limit of thickness of the non-magnetic layer 103 is determined under the condition that a direct magnetic mutual interaction acting between the free layer 101 and the pinned layer 102 is negligible. Further, an upper limit of thickness of the non-magnetic layer 103 is determined under the condition that, when flowing a current into the magnetoresistive element MTJ, a conduction electron which transmits the pinned layer 102 does not change its direction of spin until it reaches the free layer 101 (thinner than spin diffusion length).

The free layer 101 and the pinned layer 102 are comprised, for instance, Co, Fe, Ni, or an alloy including at least one of them. The antiferromagnetic layer 104 is comprised, for instance, Fe—Mn, Pt—Mn, Pt—Cr—Mn, Ni—Mn, Pd—Mn, NiO, $Fe_2O_3$, or magnetic semiconductor.

The non-magnetic layer 103 is comprised, for instance, a non-magnetic metal, a non-magnetic semiconductor, or an insulator. As the non-magnetic metal, for instance, Au, Cu, Cr, Zn, Ga, Nb, Mo, Ru, Pd, Ag, Hf, Ta, W, Pt, Bi, or an alloy including at least one them is used.

In the case where the non-magnetic layer 103 is caused to function as a tunnel barrier layer, the non-magnetic layer 103 is comprised $Al_2O_3$, $SiO_2$, MgO, AlN or the like.

In order to make a magnetization state of the magnetoresistive element MTJ parallel, the spin injection current is caused to flow from a terminal A toward a terminal B. That is, electrons are caused to flow from the pinned layer 102 toward the free layer 101.

At this time, many electrons passing through the pinned layer 102 are made spin-polarized with the same direction as magnetization direction of the pinned layer 102. Therefore, these spin-polarized electrons supply spin torque to the free layer 101, with the result that the magnetization direction of the free layer 101 becomes the same direction (parallel) as the magnetization direction of the pinned layer 102.

In order to make a magnetization state of the magnetoresistive element MTJ anti-parallel, the spin injection current is caused to flow from the terminal B toward the terminal A. That is, electrons are caused to flow from the free layer 101 toward the pinned layer 102.

At this time, the electrons made spin-polarized in opposite direction to the magnetization direction of the pinned layer 102 among the electrons having passed through the free layer 101 supply the spin torque to the free layer 101, while returning to the free layer 101 again after being reflected by the pinned layer 102. As a result, the magnetization direction of the free layer 101 becomes opposite (anti-parallel) to the magnetization direction of the pinned layer 102.

As described above, the example of the present invention is effective for the semiconductor memory having the resistance change element as the memory cell, such as for instance, the magnetic random access memory without being limited thereto. The examples of the present invention can be applied to a general semiconductor memory performing read by sensing minute signal difference.

4. CONCLUSION

According to the examples of the present invention, it is possible to realize the sense amplifier capable of sensing minute current difference at high speed.

Additional advantages and modifications will readily occur to those skilled in the art. Therefore, the invention in its broader aspects is not limited to the specific details and representative embodiments shown and described herein. Accordingly, various modifications may be made without departing from the spirit or scope of the general inventive concept as defined by the appended claims and their equivalents.

What is claimed is:

1. A sense amplifier comprising:
a first FET of a first conductive type in which a drain is connected to a first output node, a gate is connected to a second output node, and a source is connected to a first power source node;
a second FET of a first conductive type in which a drain is connected to the second output node, a gate is connected to the first output node, and a source is connected to the first power source node;
a third FET of a second conductive type in which a drain is connected to the first output node, a gate is connected to the second output node, and a source is connected to a first input node;
a fourth FET of a second conductive type in which a drain is connected to the second output node, a gate is connected to the first output node, and a source is connected to a second input node;
a fifth FET of a second conductive type in which a drain is connected to the first input node, and a source is connected to a second power source node; and
a sixth FET of a second conductive type in which a drain is connected to the second input node, and a source is connected to the second power source node,
wherein the sense operation is started by charging or discharging the first output node from the first input node with a first current and by charging or discharging the second output node from the second input node with a second current, and the fifth and sixth FETs are turned off at starting the sense operation and turned on after starting the sense operation.

2. The sense amplifier according to claim 1,
wherein a driving current of the fifth FET is larger than the first current, and a driving current of the sixth FET is larger than the second current.

3. The sense amplifier according to claim 1,
wherein the first and second output nodes are short-circuited to the first power source node before starting the sense operation.

4. The sense amplifier according to claim 1,
wherein the first and second output nodes are equalized before starting the sense operation.

5. The sense amplifier according to claim 1,
wherein the first current is supplied to the first input node by a first current mirror circuit, and the second current is supplied to the second input node by a second current mirror circuit.

6. The sense amplifier according to claim 1,
wherein the first conductive type is an N-channel type, and the second conductive type is a P-channel type.

7. The sense amplifier according to claim 6,
wherein a voltage applied to the first power source node is lower than a voltage applied to the second power source node.

8. The sense amplifier according to claim 1,
wherein the first conductive type is a P-channel type, and the second conductive type is an N-channel type.

9. The sense amplifier according to claim 8,
wherein a voltage applied to the first power source node is higher than a voltage applied to the second power source node.

10. The sense amplifier according to claim 1,
wherein the sense amplifier is a current differential sense amplifier.

* * * * *